(12) United States Patent
Youssef et al.

(10) Patent No.: US 12,152,941 B2
(45) Date of Patent: Nov. 26, 2024

(54) METHOD FOR MONITORING AN ELECTRICAL INSTALLATION COMPRISES

(71) Applicant: Schneider Electric Industries SAS, Rueil Malmaison (FR)

(72) Inventors: Wedian Youssef, Grenoble (FR); Philippe Schuster, Grenoble (FR); Christophe Kilindjian, Meylan (FR); Bruno Reymond, Moirans (FR); Sylvain Marie, Grenoble (FR); Gabriel Rilling, Grenoble (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 692 days.

(21) Appl. No.: 17/117,202

(22) Filed: Dec. 10, 2020

(65) Prior Publication Data

US 2021/0181029 A1 Jun. 17, 2021

(30) Foreign Application Priority Data

Dec. 12, 2019 (FR) ....................................... 1914307

(51) Int. Cl.
| | |
|---|---|
| *G01K 1/024* | (2021.01) |
| *G01K 1/02* | (2021.01) |
| *G01K 7/02* | (2021.01) |
| *G01R 15/18* | (2006.01) |
| *G01R 19/00* | (2006.01) |

(52) U.S. Cl.
CPC ............. *G01K 1/024* (2013.01); *G01K 1/026* (2013.01); *G01K 7/02* (2013.01); *G01R 15/181* (2013.01); *G01R 19/0092* (2013.01)

(58) Field of Classification Search
CPC .......... G01K 1/024; G01K 1/026; G01K 7/00; G01R 15/181; G01R 15/12; G01R 15/146; G01R 19/0092; G01R 19/00; G01R 19/02; G01R 19/03; G01R 19/10
See application file for complete search history.

(56) References Cited

U.S. PATENT DOCUMENTS

| | | | |
|---|---|---|---|
| 2011/0213744 A1* | 9/2011 | Sparling | ............ G05B 23/0227 |
| | | | 706/46 |
| 2015/0168470 A1 | 6/2015 | Dougherty | |
| 2018/0261996 A1 | 9/2018 | Kikuchi et al. | |

OTHER PUBLICATIONS

Republique Francaise Institut National De La Propriete Industrielle, French Search Report and Opinion for French Patent Application No. FR1914307 dated Aug. 19, 2020, 8 pages.

* cited by examiner

*Primary Examiner* — Son T Le
*Assistant Examiner* — Brian Butler Geiss
(74) *Attorney, Agent, or Firm* — Locke Lord LLP

(57) ABSTRACT

A method for monitoring an electrical installation comprises:
  while the installation is in operation, measuring electrical currents that flow through the installation and temperature values at predefined locations in the installation;
  using a numerical model acquired beforehand, computing a numerical index representative of thermal properties of the installation, from differences between the measured temperature values and corresponding temperature values estimated by means of said model from the measured current values; and
  detecting a thermal anomaly when the computed numerical index differs from a reference value.

15 Claims, 3 Drawing Sheets

METHOD FOR MONITORING AN ELECTRICAL INSTALLATION COMPRISES

TECHNICAL FIELD

The present invention relates to methods and systems for monitoring electrical installations.

The invention relates more particularly to power distribution installations, such as electrical cabinets and electrical switchboards, notably in the low voltage domain, although this example is not limiting and other applications are possible.

In practice, the invention is applicable to any electrical installation.

BACKGROUND

In many commercial, domestic and industrial installations, the electricity from an energy supply is distributed to the end users via one or more distribution installations.

Typically, such installations are periodically the subject of inspection visits and preventive maintenance operations, aiming to detect and correct any defects which could hamper the correct operation of the installation.

For example, during such visits, it is common practice to search for thermal defects, such as hot spots, with specific measurement means, such as infrared cameras. These hot spots can occur at connections between conductive elements that are passed through by currents of high intensity and can be the source of fires or major safety problems.

However, the maintenance methods are not fully satisfactory. On the one hand, the inspection intervals are generally spaced apart in time and do not make it possible to report on a sudden change (such as a failure) that can have adverse consequences in the very short term. On the other hand, these methods are sometimes lengthy and complex to implement.

Furthermore, such inspections require the opening of the electrical cabinet in which all or part of the electrical installation is housed (it being understood that the electrical installation is generally protected from its immediate environment by a door or a hatch which is normally closed), which introduces, at the time of the inspection, heat exchanges which are not representative of the real operating conditions, to the point of complicating the interpretation of the measured data.

SUMMARY

There is therefore a need for methods and devices that make it possible to monitor an electrical installation, notably in order to detect, continuously when the installation is operating, a thermal anomaly.

Thus, according to one aspect, a method for monitoring an electrical installation comprises:
- while the installation is in operation, measuring over time electrical currents that flow through the installation and temperature values at predefined locations in the installation by means, respectively, of current sensors and temperature sensors disposed in the installation;
- by an electronic data processing device and using a numerical model acquired beforehand, automatically computing a numerical index representative of thermal properties of the installation, from differences between the measured temperature values and corresponding temperature values estimated by means of said model from the measured current values;
- by the electronic processing device, detecting a thermal anomaly when the computed numerical index is different from a reference value.

The fact of being able to detect a thermal anomaly in the installation makes it possible to rapidly identify the occurrence of a defect or of a situation likely to create a defect that can compromise the safety of the installation. This detection is performed continuously when the installation is operating. It makes it possible to obtain a good responsiveness and can be implemented simply, without needing to mobilize specially qualified personnel.

According to advantageous but nonmandatory aspects, such a method can incorporate one or more of the following features, taken alone or according to any technically admissible combination:
- the numerical model is representative of thermal properties of the electrical installation and is configured to associate current values measured by the current sensors with temperature values estimated for the locations at which the temperature sensors are positioned, this numerical model being previously parameterized by learning on the electrical installation.
- the relationship between the temperature estimated for one of the locations and the current values measured in the installation is given by the following formula:

$$\theta_t^i = \alpha_i + \sum_{k=1}^{L} \sum_{l=1}^{m} \alpha_{k,l} \theta_{t-k}^l + \sum_{k=1}^{q} \sum_{l=1}^{m} \beta_{k,l} P_{t-k}^l + n_t$$

in which $\theta_t^i$ designates the temperature estimated for this location at a given instant, $\theta_{t-1}^i$ designates the temperature estimated for this same location at a preceding instant, "n" is the statistical noise associated with the temperature sensor for this instant, "m" is the number of current sensors, "L" is the duration of the measurement window, "P" is the thermal power which depends on the measured currents and "α" and "β" are parameters of the numerical model.
- the method comprises a preliminary step of parameterizing of the numerical model, this step comprising operations consisting in:
  - while the installation is in operation, measuring over time electrical currents that flow through conductors of the installation and temperature values at predefined locations in the installation by means, respectively, of the current sensors and the temperature sensors disposed in the installation;
  - computing parameters of the model from the measured current and temperature values.
- computing the parameters of the model comprises an operation consisting in minimizing the mean square error given by the following formula, for each pair of current and voltage sensors, from a training dataset derived from the installation and for which the installation has experienced no anomaly:

$$\hat{\alpha}_{k,l}, \hat{\beta}_{k,l} =$$
$$\mathrm{argmin}_{\alpha, \beta} \sum_t \sum_{i=0}^{m} \left( \theta_t^i - \alpha_0 - \sum_{k=1}^{P} \alpha_{k,l} \theta_{t-k}^l + \sum_{k=0}^{q} \sum_{l=1}^{n} \beta_{k,l} P_{t-k}^l \right)^2$$

in which $\theta_t^i$ designates the temperature estimated for this location at a given instant, $\theta_{t-1}^i$ designates the temperature estimated for this same location at a preceding instant, "n" is the number of temperature sensors, "m" is the number of current sensors, "L" is the duration of the measurement window, "P" is the thermal power which depends on the measured currents and α and β are parameters of the numerical model.

the method also comprises a step of sending of an alert message when a thermal anomaly is detected.

the computing of the numerical index and the detection of an anomaly are performed by the electronic data processing device in a remote computer server, and in which the method comprises a step of transmission of the measured data to the electronic data processing device by a telecommunications link.

the temperature sensors and the current sensors are coupled to a data concentrator configured to transmit the measured data to the electronic control device by a telecommunications link.

According to another aspect, the invention relates to a monitoring system for an electrical installation, comprising a plurality of current sensors and a plurality of temperature sensors that can be disposed in the installation, and an electronic data processing device, the monitoring system being configured to implement a method comprising steps consisting in:

while the installation is in operation, measuring over time electrical currents that flow through the installation and temperature values at predefined locations in the installation by means, respectively, of the current sensors and temperature sensors disposed in the installation;

by the electronic data processing device and using a numerical model acquired beforehand, automatically computing a numerical index representative of thermal properties of the installation, from differences between the measured temperature values and corresponding temperature values estimated by means of said model from the measured current values;

by the electronic processing device, detecting a thermal anomaly when the computed numerical index is different from a reference value.

According to another aspect, the invention relates to an electrical installation comprising a monitoring system as described previously.

BRIEF DESCRIPTION OF THE DRAWINGS

The invention will be better understood and other advantages thereof will become more clearly apparent in light of the following description of an embodiment of a method given purely by way of example and with reference to the attached drawings, in which.

DETAILED DESCRIPTION

Figure 1:
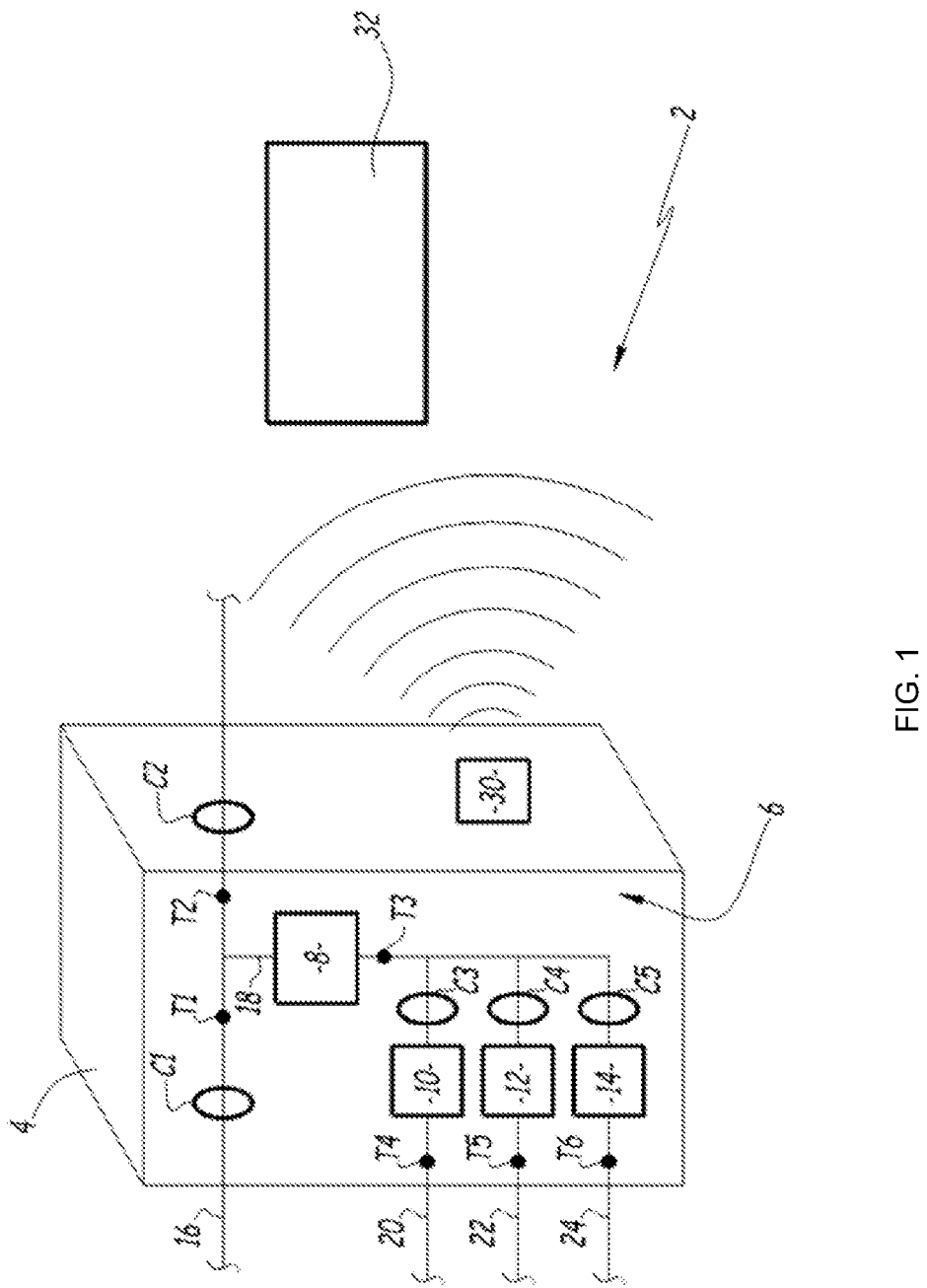
FIG. 1 is a block diagram of an electrical distribution installation comprising a monitoring device according to embodiments.

Referring to FIG. 1, an electrical installation 2, such as an electricity distribution installation, is represented.

In this example, the installation 2 is disposed in an electrical cabinet 4 or in a container.

As an example, the installation 2 comprises a set of busbars 6, comprising electrical conductors interconnected with one another by means of bolts, screws, connecting parts or connectors.

The installation 2 can also comprise one or more electrical units, such as electrical protection units or switching units, or measurement units.

In this example, the installation 2 comprises four such units, bearing the references 8, 10, 12 and 14. This example is not limiting and many other configurations are possible.

For example, said units can be circuit breakers, or contactors, or fuse-holders, or relays, or disconnectors, or switches, or any equivalent unit.

Generally, the implementations of the invention can be implemented in any electrical installation, and not only a power distribution installation.

In the example illustrated, a first electrical conductor 16 conveys the electricity from an external source. A second electrical conductor 18 is connected to the first conductor 16 and to third conductors 20, 22 and 24 to distribute the electricity to electrical appliances situated downstream of the installation 2 via these third conductors 20, 22 and 24.

For example, the protection unit 8 is associated with the second conductor 18 and the protection units 10, 12 and 14 are associated, respectively, with the third conductors 20, 22 and 24.

This example is not limiting and, here again, many other architectures and configurations are possible.

The installation 2 also comprises a monitoring system, more particularly configured to detect a thermal anomaly in the installation 2.

For example, a thermal anomaly here designates a drift in time of at least one or several thermal properties of the installation 2, these thermal properties being able to be temperature values at precise locations of the installation 2.

In practice, such a thermal drift is often indicative of a defect of electrical origin, or a sudden failure of a component, or a defect of mechanical origin such as a poorly connected electrical connection, for example a bad tightening of a bolt or of a screw at an electrical connection, or any other defect likely to be prejudicial to the correct operation of the installation.

Such a thermal drift can also be indicative of modifications of behaviours of ageing components, or alterations of heat exchange properties caused by the build-up of foreign materials, such as the build-up of dust, or the blocking of a cooling orifice.

In many embodiments, the monitoring system, the components of which are visible in FIG. 1, comprises a plurality of current sensors, here denoted C1, C2, C3, C4 and C5, a plurality of temperature sensors, here denoted T1, T2, T3, T4, T5, T6, and an electronic data processing device 32. The number of temperature and/or current sensors is not limiting and can be different without altering the principle of the invention.

The current and temperature sensors can be based on a conventional technology. For example, the current sensors are measurement torii, such as Rogowski sensors. The temperature sensors can be thermocouples, or any other appropriate sensor technology.

In the example illustrated, two current sensors C1 and C2 are placed on the first conductor 16, upstream and downstream of the point of connection with the second conductor 18 and one current sensor C3, C4, C5 is associated with each of the third conductors 20, 22 and 24.

Still in the example illustrated, the two temperature sensors T1 and T2 are associated with the first conductor 16, upstream and downstream of the point of connection with the second conductor 18, the temperature sensor T3 is associated with the second conductor 18 upstream of the points of connection with the third conductors 20, 22 and 24, and the temperature sensors T4, T5, T6 are respectively associated with the third conductors 20, 22 and 24.

This example is not limiting and many other configurations are possible.

Optionally, the monitoring system can comprise a data concentrator 30, coupled to the temperature and current sensors, the function of which is to collect the data measured by the temperature and current sensors and send these data to the processing device 32, notably when the processing device 32 is placed remotely from the cabinet 4 and/or it is not directly connected to said sensors.

For example, the concentrator 30 comprises a first communication interface programmed to receive data from the sensors, for example via a wired link or a wireless link, preferably a short range radio link. The concentrator 30 also comprises a second communication interface, programmed to transfer the measured data to the processing device 32, for example via a wired link, or a wireless link, for example by the internet network or a long range radio link, or by a telecommunication network of 3G, 4G or 5G type, or any other similar means.

In many embodiments, the processing device 32 comprises a processor and a memory. For example, the processor is a programmable microcontroller or a microprocessor.

The memory is preferably a computer memory forming a computer-readable data storage medium. For example, the memory comprises a ROM memory, or a RAM memory, or a nonvolatile memory of EEPROM type, or Flash memory, or any equivalent means.

The memory comprises executable instructions and/or a software code for implementing a method for monitoring the installation 2 as described hereinbelow when these instructions are executed by the processor.

As a variant, the processing device 32 can be implemented by a programmable logic component of FPGA type or by a dedicated integrated circuit configured to implement said monitoring method.

Generally, the monitoring system is notably configured to implement a method comprising steps consisting in:
  while the installation is in operation, measuring over time electrical currents that flow through conductors of the installation and temperature values at predefined locations in the installation by means, respectively, of the current sensors C1, C2, C3, C4, C5 and the temperature sensors T1, T2, T3, T4, T5, T6 previously disposed in the installation;
  by the electronic data processing device 32 and using a numerical model acquired beforehand, automatically computing a numerical index representative of thermal properties of the installation, from differences between the measured temperature values and corresponding temperature value estimated by means of said model from the measured current values,
  by the electronic processing device, detecting a thermal anomaly when the computed numerical index is different from a reference value.

Figure 2:
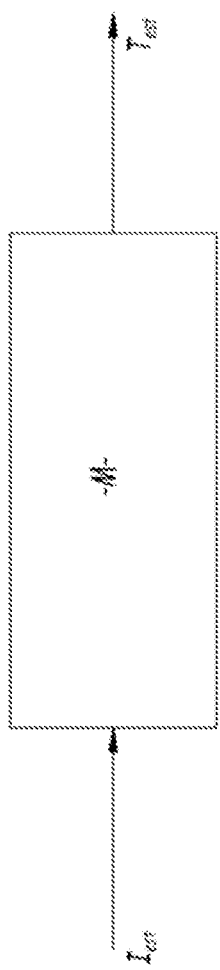
FIG. 2 is a block diagram of a model used by the monitoring device of FIG. 1.

Preferably, as schematically illustrated in FIG. 2, the numerical model, denoted M, is representative of thermal properties of the electrical installation and is configured to associate current values, collectively denoted $I_{mes}$, measured by the current sensors C1, C2, C3, C4, C5 with estimated temperature values, collectively denoted $T_{est}$, for the locations at which the temperature sensors T1, T2, T3, T4, T5, T6 are positioned.

In other words, the model M is an estimation of the transfer function which links, for each instant, temperatures at different locations of the installation to current values for this same instant and to temperature values for an immediately preceding measurement instant.

In a first approximation, the model M can be a linear model that takes account only of the first order heat exchangers, it being possible for the higher order nonlinear contributions, for example due to convection, conduction or radiation phenomena, to be disregarded initially.

Preferably, the measurements are performed repeatedly for a plurality of discrete instants or for time windows having a predefined duration.

The measurements can be repeated regularly or periodically, with a predefined periodicity.

According to preferred examples, the relationship between, on the one hand, the temperature $\theta_t^i$ estimated for one of the locations at a given instant (instant "t") and, on the other hand, the current values measured in the installation for this instant and the temperature values for the preceding instant, is given by the following formula:

$$\theta_t^i = \alpha_i + \sum_{k=1}^{L} \sum_{l=1}^{m} \alpha_{k,l} \theta_{t-k}^l + \sum_{k=1}^{q} \sum_{l=1}^{m} \beta_{k,l} P_{t-k}^l + n_t$$

in which:
  $\Theta_{t-1}^i$ designates the temperature estimated for the same location at a preceding instant (instant "t−1"),
  "$n_t$" is the statistical noise associated with the temperature sensor for this instant,
  "m" is the number of current sensors,
  "L" is the duration of the measurement window,
  "P" is the thermal power which depends on the measured currents, and more particularly the square of the measured currents,
  "α" and "β" are parameters of the numerical model, and
  "k" and "l" are indices used for the summation.

For example, the model M can be expressed in the form of a matrix with n rows and with m columns ("n" being the number of temperature sensors) and whose coefficients are numerical values.

Advantageously, the numerical model M is parameterized beforehand by learning on the electrical installation. The duly parameterized model is then stored in memory of the device 32.

For example, prior to the start of monitoring of the installation 2, a preliminary step of parameterizing of the numerical model is implemented, this step comprising operations consisting in:
  while the installation is in operation, measuring over time electrical currents that flow through conductors of the installation and temperature values at predefined locations in the installation by means, respectively, of the current sensors C1, C2, C3, C4, C5 and the temperature sensors T1, T2, T3, T4, T5, T6 disposed in the installation;
  computing parameters of the model from the measured current and temperature values.

For example, computing the parameters of the model comprises an operation consisting in minimizing the mean square error given by the following formula, for each pair of current and voltage sensors, from a training dataset derived from the installation and for which the installation has not experienced any anomaly:

$$\hat{\alpha}_{k,l} \hat{\beta}_{k,l} =$$

-continued $$\mathrm{argmin}_{\alpha,\beta} \sum_t \sum_{i=0}^m \left( \theta_t^i - \alpha_0 - \sum_{k=1}^P \alpha_{k,l} \theta_{t-k}^l + \sum_{k=0}^q \sum_{l=1}^n \beta_{k,l} P_{t-k}^l \right)^2$$

in which $\theta_t^i$ designates the temperature estimated for the location indexed by the index "i" at a given instant, $\theta_{t-1}^i$ designates the temperature estimated for the same location at a preceding instant, "n" is the number of temperature sensors, "m" is the number of current sensors, "L" is the duration of the measurement window, "P" is the thermal power which depends on the measured currents and $a_{k,l}, \beta_{k,l}$ are parameters of the numerical model, corresponding here to a coefficient of the matrix associated with the model M (for example, the coefficients of the kth column and of the lth line).

By virtue of the invention, the fact of being able to detect a thermal anomaly in the installation makes it possible to rapidly identify the occurrence of a defect or of a situation likely to lead to a defect that can compromise the safety of the installation. This detection is performed continually when the installation is in operation. It makes it possible to obtain a good responsiveness and can be implemented simply, without needing to mobilize specially qualified personnel.

Since the numerical model is constructed by means of a learning phase performed on the installation, the method can be deployed on any type of installation without needing manual parameterization. On the contrary, the model is adapted automatically to the specifics of the installation during the learning phase. In other words, the learning phase makes it possible to construct the model from an operating sequence used as reference (since there is an assurance that the installation has not suffered any defect during this time period) from which differences from normal are then identified.

Figure 3:
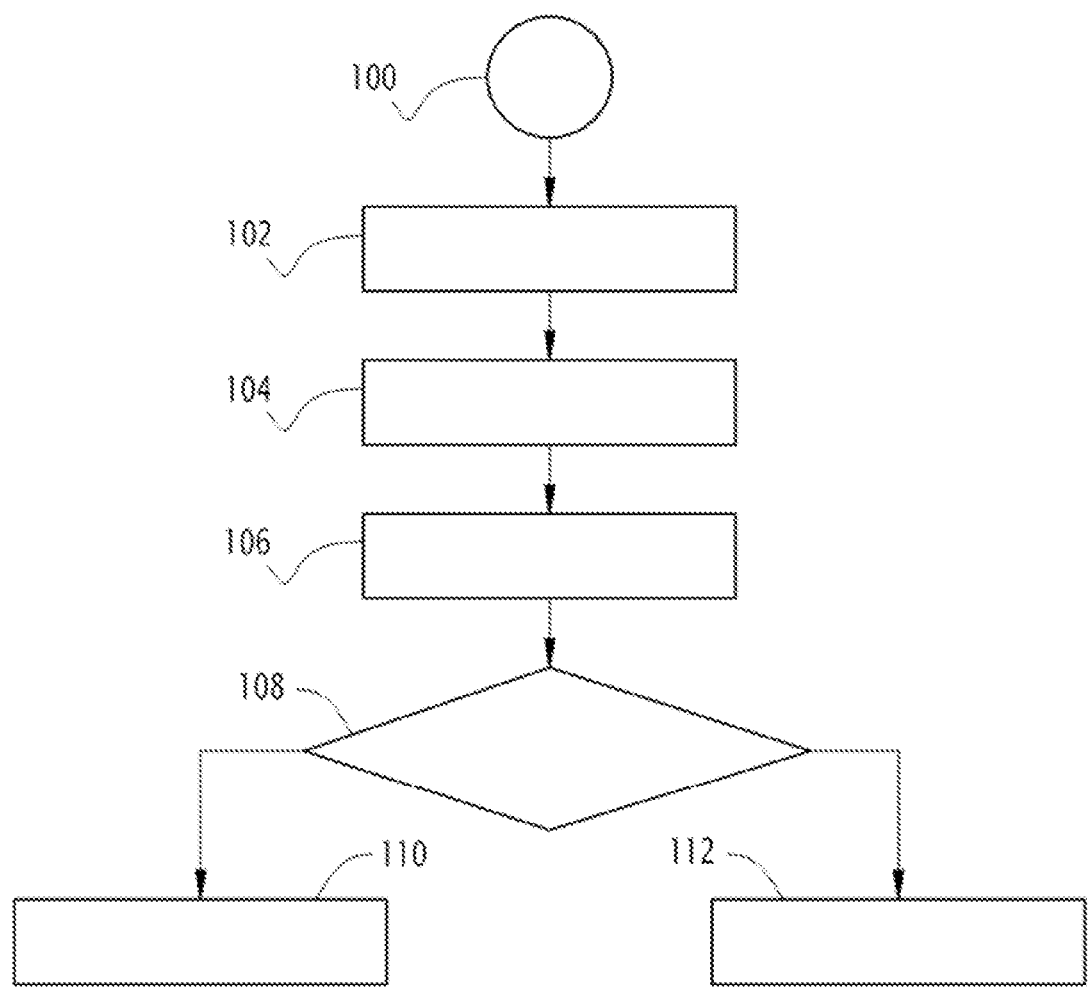
FIG. 3 is a flow diagram of a monitoring method implemented by the monitoring device of FIG. 1 according to embodiments.

Referring to FIG. 3, an example of implementation of the method for monitoring the installation 2 is described.

However, as a variant, these steps could be executed in a different order. Certain steps could be omitted. The example described does not preclude, in other embodiments, other steps being implemented jointly and/or sequentially with the steps described.

The method is started in a step 100. For example, prior to this step 100, a model M parameterized as a function of the specifics of the installation 2 has been acquired previously.

In a step 102, electrical currents that flow through conductors of the installation and temperature values at predefined locations of the installation are measured over time, by means, respectively, of the current sensors C1, C2, C3, C4, C5 and the temperature sensors T1, T2, T3, T4, T5, T6 disposed in the installation. The measurements can be repeated in time, as explained previously.

Optionally, in a step 104, the data measured by the sensors are transmitted to the electronic data processing device 32 by a telecommunications link.

This step is, for example, implemented when the device 32 is situated remotely from the cabinet 4, for example when the device 32 forms part of a remote computer server.

In a step 106, the device 32 automatically calculates a numerical index representative of thermal properties of the installation, from differences between the measured temperature values and corresponding temperature values estimated by means of said model M from the measured current values.

For example, the index is representative of a difference between the temperatures measured by the sensors at each instant and the corresponding temperatures estimated for these instants by virtue of the model, this estimation being performed from currents measured and temperatures estimated for the preceding instant.

As an example given for illustration purposes, the numerical index is chosen to be equal to the product of the distance between the measured temperatures and estimated temperatures, this distance being adjusted by the correlation estimated at the end of the parameterizing phase and estimated on the validation signals after the learning phase. In other words, the model is, here, established in the learning phase from a major part of the measured data (for example 75% of these data) then validated with data different from those that were used to construct the model (for example, the remaining 25% of data).

This example is not limiting and, as a variant, other numerical indices or scores or metrics can be chosen.

In a step 108, the system 32 automatically compares the computed numerical index, or score, with one or more reference values.

For example, a threshold of values considered to correspond to normal operation can be defined previously.

The installation 2 is then considered to exhibit an abnormal drive (step 110) if the computed score is located outside of this interval. The reference value or values can be stored previously in memory of the device 32.

As a variant, only one threshold value may be defined. It is then considered that an abnormal drift has occurred (step 110) if the computed score is above (or, in other examples, below) the threshold value.

According to variants, the comparison (step 108) can be performed on a history of computed score values, an abnormal situation then being considered to have occurred if the score remains outside of a range of normal values (or above or below a threshold value) for a sufficiently long period, so as to avoid false positives due to a sudden and unexpected variation.

Optionally, the method can comprise a step of sending of an alert message when a thermal anomaly is detected. In the example illustrated, the message is sent in the step 110.

If no anomaly is detected (step 112), then the method continues to be implemented, for example by repeating the steps 102 to 108 previously described.

Any feature of one of the embodiments or variants described above can be implemented in the other embodiments and variants described.

The invention claimed is:

1. A method for continuously monitoring an electrical installation comprising:

while the installation is in operation, measuring on a continuous basis over time electrical currents that flow through the installation and temperature values at predefined locations in the installation by means, respectively, of current sensors and temperature sensors disposed in the installation at the predefined locations, wherein the predefined locations are one or more upstream and/or downstream locations relative to one or more points of connection of conductors of the installation through which the electrical currents flow;

by an electronic data processing device and using a numerical model acquired beforehand, automatically computing, on a continuous basis, a numerical index representative of thermal properties of the installation, from differences between the measured temperature values and corresponding temperature values estimated by means of said model from the measured current values;

by the electronic processing device, detecting, on a continuous basis, a thermal anomaly when the computed numerical index differs from a reference value;

based on the detected thermal anomaly and using the predefined locations of the current sensors and temperature sensors, identifying an occurrence and a location of a defect or of a situation likely to lead to a defect at the identified location that can compromise safety of the installation; and responding to the identification of the occurrence of the defect or situation by providing the identified location for correcting the defect or situation using the identified location, to mitigate a compromise of safety, wherein the numerical model is representative of thermal properties of the electrical installation and is configured to associate current values measured by the current sensors with temperature values estimated for the locations at which the temperature sensors are positioned, the numerical model being previously parameterized by learning performed on the electrical installation; and wherein the relationship between the temperature estimated for one of the locations and the current values measured in the installation is given by the following formula:

$$\theta_t^i = \alpha_i + \sum_{k=1}^{L} \sum_{l=1}^{m} \alpha_{k,l} \theta_{t-k}^l + \sum_{k=1}^{q} \sum_{l=1}^{m} \beta_{k,l} P_{t-k}^l + n_t$$

in which $\theta_t^i$ designates the temperature estimated for this location at a given instant, $\theta_{t-1}^i$ designates the temperature estimated for this same location at a preceding instant, "n" is a statistical noise associated with the temperature sensor for this instant, "m" is the number of current sensors, "L" is the duration of the measurement window, "P" is the thermal power which depends on the measured currents and "$\alpha$" and "$\beta$" are parameters of the numerical model.

2. The method according to claim 1, which comprises a preliminary step of parameterizing of the numerical model, the preliminary step comprising:

while the installation is in operation, measuring, over time, the electrical currents that flow through the conductors of the installation and temperature values at the predefined locations in the installation by means, respectively, of the current sensors and the temperature sensors disposed in the installation;

computing parameters of the model from the measured current and temperature values.

3. The method according to claim 1, which comprises a preliminary step of parameterizing of the numerical model, the preliminary step comprising:

while the installation is in operation, measuring, over time, electrical currents that flow through conductors of the installation and temperature values at the predefined locations in the installation by means, respectively, of the current sensors and the temperature sensors disposed in the installation;

computing parameters of the model from the measured current and temperature values; and in which computing the parameters of the model comprises minimizing a mean square error given by the following formula, for each pair of current and voltage sensors, from a training dataset derived from the installation and for which the installation has experienced no anomaly:

$$\hat{\alpha}_{k,l}\hat{\beta}_{k,l} = \operatorname{argmin}_{\alpha,\beta} \sum_t \sum_{i=0}^{m} \left( \theta_t^i - \alpha_0 - \sum_{k=1}^{P} \alpha_{k,l} \theta_{t-k}^l + \sum_{k=0}^{q} \sum_{l=1}^{n} \beta_{k,l} P_{t-k}^l \right)^2$$

in which $\theta_t^i$ designates the temperature estimated for this location at a given instant, $\theta_{t-1}^i$ designates the temperature estimated for this same location at a preceding instant, "n" is the number of temperature sensors, "m" is the number of current sensors, "L" is the duration of the measurement window, "P" is the thermal power which depends on the measured currents and $\alpha$ and $\beta$ are parameters of the numerical model.

4. The method according to claim 1, which also comprises sending of an alert message when a thermal anomaly is detected.

5. The method according to claim 1, wherein the computing of the numerical index and the detection of an anomaly are performed by the electronic data processing device in a remote computer server, and wherein the method comprises transmission of the measured data to the electronic data processing device by a telecommunications link.

6. The method according to claim 1, wherein the temperature sensors and the current sensors are coupled to a data concentrator configured to transmit the measured data to an electronic control device by a telecommunications link.

7. The method according to claim 1, which also comprises taking actions to correct the defect or situation using the identified defect and the identified location.

8. A monitoring system for an electrical installation, comprising a plurality of current sensors and a plurality of temperature sensors that can be disposed in the installation, and an electronic data processing device, the monitoring system being configured to implement a method comprising:

while the installation is in operation, measuring on a continuous basis over time electrical currents that flow through the installation and temperature values at predefined locations in the installation by means, respectively, of current sensors and temperature sensors disposed in the installation at the predefined locations, wherein the predefined locations are one or more upstream and/or downstream locations relative to one or more points of connection of conductors of the installation through which the electrical currents flow;

by the electronic data processing device and using a numerical model acquired beforehand, automatically computing on a continuous basis a numerical index representative of thermal properties of the installation, from differences between the measured temperature values and corresponding temperature values estimated by means of said model from the measured current values;

by the electronic processing device, detecting on a continuous basis a thermal anomaly when the computed numerical index is different from a reference value;

based on the detected thermal anomaly and using the predefined locations of the current sensors and temperature sensors, identifying an occurrence and a location of a defect or of a situation likely to lead to a defect at the identified location that can compromise safety of the installation; and responding to the identification of the occurrence of the defect or situation by providing the identified location for correcting the defect or situation using the identified location, to mitigate a compromise of safety, wherein the numerical model is representative of thermal properties of the electrical installation and is configured to associate current values measured by the current sensors with temperature values estimated for the locations at which the temperature sensors are positioned, this numerical model being previously parameterized by learning performed on the electrical installation; and wherein the relationship between the temperature estimated for one of the locations and the current values measured in the installation is given by the following formula:

$$\theta_t^i = \alpha_i + \sum_{k=1}^{L}\sum_{l=1}^{m} \alpha_{k,l}\theta_{t-k}^l + \sum_{k=1}^{q}\sum_{l=1}^{m} \beta_{k,l}P_{t-k}^l + n_t$$

in which $\theta_t^i$ designates the temperature estimated for this location at a given instant, $\theta_{t-1}^i$ designates the temperature estimated for this same location at a preceding instant, "n" is a statistical noise associated with the temperature sensor for this instant, "m" is the number of current sensors, "L" is the duration of the measurement window, "P" is the thermal power which depends on the measured currents and "a" and "B" are parameters of the numerical model.

9. Electrical installation comprising a monitoring system according to claim 8.

10. The monitoring system according to claim 9, wherein the method comprises a preliminary step of parameterizing of the numerical model, the preliminary step comprising:

while the installation is in operation, measuring, over time, the electrical currents that flow through the conductors of the installation and temperature values at the predefined locations in the installation by means, respectively, of the current sensors and the temperature sensors disposed in the installation;

computing parameters of the model from the measured current and temperature values.

11. The monitoring system according to claim 8, wherein the method comprises a preliminary step of parameterizing of the numerical model, the preliminary step comprising:

while the installation is in operation, measuring, over time, the electrical currents that flow through the conductors of the installation and temperature values at the predefined locations in the installation by means, respectively, of the current sensors and the temperature sensors disposed in the installation;

computing parameters of the model from the measured current and temperature values; and in which computing the parameters of the model comprises minimizing a mean square error given by the following formula, for each pair of current and voltage sensors, from a training dataset derived from the installation and for which the installation has experienced no anomaly:

$$\hat{\alpha}_{k,l}\hat{\beta}_{k,l} = \mathrm{argmin}_{\alpha,\beta} \sum_t \sum_{i=0}^{m} \left(\theta_t^i - \alpha_0 - \sum_{k=1}^{P}\alpha_{k,l}\theta_{t-k}^l + \sum_{k=0}^{q}\sum_{l=1}^{n}\beta_{k,l}P_{t-k}^l\right)^2$$

in which $\theta_t^i$ designates the temperature estimated for this location at a given instant, $\theta_{t-1}^i$ designates the temperature estimated for this same location at a preceding instant, "n" is the number of temperature sensors, "m" is the number of current sensors, "L" is the duration of the measurement window, "P" is the thermal power which depends on the measured currents and a and B are parameters of the numerical model.

12. The monitoring system according to claim 8, wherein the method comprises sending of an alert message when a thermal anomaly is detected.

13. The monitoring system according to claim 8, wherein the computing of the numerical index and the detection of an anomaly are performed by the electronic data processing device in a remote computer server, and wherein the method comprises transmission of the measured data to the electronic data processing device by a telecommunications link.

14. The monitoring system according to claim 8, wherein the temperature sensors and the current sensors are coupled to a data concentrator configured to transmit the measured data to an electronic control device by a telecommunications link.

15. The monitoring system according to claim 8, wherein the method comprises taking actions to correct the defect or situation using the identified defect and the identified location.

* * * * *